United States Patent [19]

Kojima et al.

[11] Patent Number: 4,736,167
[45] Date of Patent: Apr. 5, 1988

[54] PLL FREQUENCY SYNTHESIZER

[75] Inventors: Tatsuru Kojima; Yukio Fukumura, both of Tokyo, Japan

[73] Assignee: NEC Corporation, Japan

[21] Appl. No.: 877,408

[22] Filed: Jun. 23, 1986

[30] Foreign Application Priority Data

Jun. 27, 1985 [JP] Japan .................. 60-139113

[51] Int. Cl.[4] .............................................. H03L 7/00
[52] U.S. Cl. ........................................ 331/17; 331/25
[58] Field of Search .................. 331/17, 18, 25, 36 R, 331/36 C

[56] References Cited

U.S. PATENT DOCUMENTS 4,546,330 10/1985 Okada ............................. 331/25 X Primary Examiner—Eugene R. LaRoche
Assistant Examiner—Robert J. Pascal
Attorney, Agent, or Firm—Laff, Whitesel, Conte & Saret

[57] ABSTRACT

A phase locked loop frequency synthesizer comprises a voltage-controlled oscillator (VCO) for generating a signal having a frequency which varies in response to a control voltage. A variable frequency divider divides the output frequency of the VCO in a ratio which is determined by a control signal. A reference oscillator supplies a reference signal having a predetermined frequency. A fixed frequency divider divides the frequency of the reference signal in a fixed ratio. A phase comparator compares the phases of the outputs of the fixed frequency divider and variable frequency divider to provide a control pulse corresponding to a phase difference between these outputs. A charge pump has a power supply terminal for generating a charge/discharge voltage in response to the control pulse. A loop filter includes a first capacitor which is supplied with the charge/discharge voltage for supplying a control voltage to the VCO which corresponds to the charge/discharge voltage. A power supply circuit generates a D.C. voltage by boosting the voltage of the output of the fixed frequency divider and by supplying this boosted voltage to the charge pump. The invention finds its greatest use in a portable radio receiver.

16 Claims, 2 Drawing Sheets

PLL FREQUENCY SYNTHESIZER

BACKGROUND OF THE INVENTION

The present invention relates to a PLL (phase locked loop) frequency synthesizer, and more particularly to a frequency synthesizer for use in a battery-powered apparatus, such as a portable radio transmitter/receiver.

There is a PLL frequency synthesizer involving a charge pump circuit, which will be described in detail later. The charge pump circuit is used for electrically charging and discharging a loop filter which supplies a control voltage to a voltage-controlled oscillator (VCO). As power voltage Vcc of the charge pump circuit is used the output voltage of a voltage regulator, which is +5 V for instance in a battery-powered portable radio transmitter/receiver. For this reason, the control voltage supplied to a VCO is limited within the range of 0 to 5 V, resulting in the disadvantage that the dynamic range of the oscillation frequency is correspondingly limited. Further because of the low control voltage, there arises another problem that the Q value of the variable capacitance diode of VCO is low, resulting in deteriorating the carrier-to-noise (C/N) ratio of the VCO output. Moreover, the loop filter takes a long time to be charged or discharged, and the frequency switching of the synthesizer also is slow.

SUMMARY OF THE INVENTION

An object of the present invention, therefore, is to provide a PLL frequency synthesizer whose VCO has a broad dynamic range of oscillation frequency.

Another object of the invention is to provide a PLL frequency synthesizer whose variable capacitance diode has an increased Q value and in which the VCO output is improved in C/N ratio.

Still another object of the invention is to provide a PLL frequency synthesizer whose switching speed is increased.

According to the invention, there is provided a frequency synthesizer comprising: a voltage-controlled oscillator (VCO) for generating an oscillation of a frequency varying responsive to a control voltage; a variable frequency divider for dividing the output frequency of the VCO in a ratio according to a control signal; a reference oscillator for supplying a reference signal having a predetermined frequency; a fixed frequency divider for dividing the frequency of the reference signal in a fixed ratio; a phase comparator for comparing the phases of the outputs of the fixed frequency divider and variable frequency divider to provide a control pulse corresponding to a phase difference between these outputs; a charge pump having a power supply terminal for generating a charge/discharge voltage in response to the control pulse; a loop filter including a first capacitor supplied with the charge/discharge voltage for supplying to the VCO as the control voltage a voltage corresponding to said charge/discharge voltage; and a power supply circuit for generating a D.C. voltage by boosting the voltage of the output of said fixed frequency divider and supplying this D.C. voltage to the charge pump as power voltage.

BRIEF DESCRIPTION OF THE DRAWINGS

The above and other objects, features and advantages of the present invention will be more apparent from the detailed description hereunder taken in conjunction with the accompanying drawings, wherein.

DETAILED DESCRIPTION OF THE INVENTION

Figure 1:
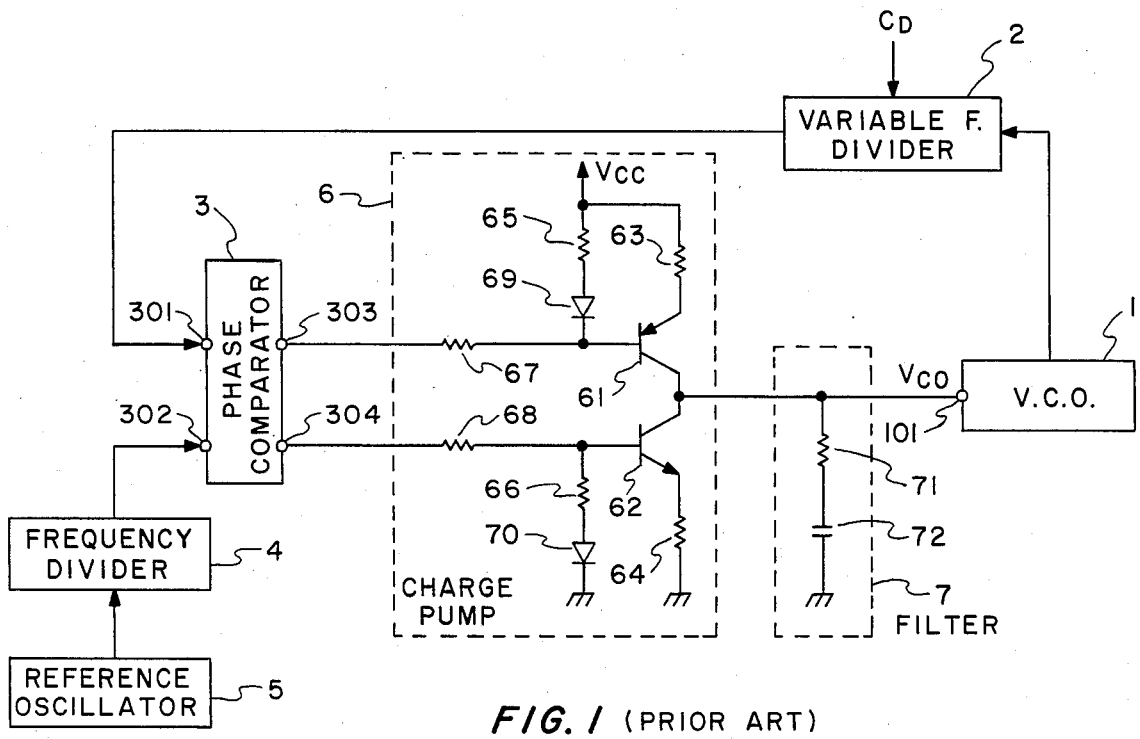
FIG. 1 is a block diagram illustrating a conventional PLL frequency synthesizer.

The PLL frequency synthesizer illustrated in FIG. 1 has a voltage-controlled oscillator (VCO) 1, which varies the oscillation frequency according to a control voltage. The output of VCO 1 is supplied to one input terminal 301 of a phase comparator 3 through a variable frequency divider 2 which divides the input frequency in accordance with a control signal $C_D$. To the other input terminal 302 of the phase comparator 3 is supplied a signal resulting from the frequency division of the output of a quartz reference oscillator 5 by a fixed frequency divider 4. The phase comparator 3 detects a phase difference between the signals supplied to its input terminals 301 and 302, and feeds a charge pump 6 with a pulse train corresponding to the phase difference.

The polarity of the phase difference corresponds to the advance or delay of the output of VCO 1 with respect to the output of the reference oscillator 5. Based on the polarity, the pulse train appears at one of output terminals 303 and 304, which are connected to the charge pump 6 comprising transistors 61 and 62, resistors 63–68 and diodes 69 and 70. If the pulse train emerges at the terminal 303, a transistor 61 is supplied with a bias voltage through the resistors 65 and 67, and thereby actuated. A capacitor 72 of a loop filter 7 is charged by a power voltage Vcc through the resistor 63, the transistor 61 and a resistor 71. The charged voltage is applied to a control terminal 101 of VCO 1 as a control voltage Vco. If the pulse train appears at the terminal 304, the transistor 62 is supplied with a bias voltage through resistors 68 and 66, and thereby actuated. The charged capacitor 72 is discharged through the transistor 62 and a resistor 64. The discharged voltage also becomes the control voltage Vco and is applied to the control terminal 101 of VCO 1. When VCO 1 reaches an oscillation frequency corresponding to the control voltage Vco applied to the control terminal 101, a phase locked loop (PLL) is locked.

Figure 3:
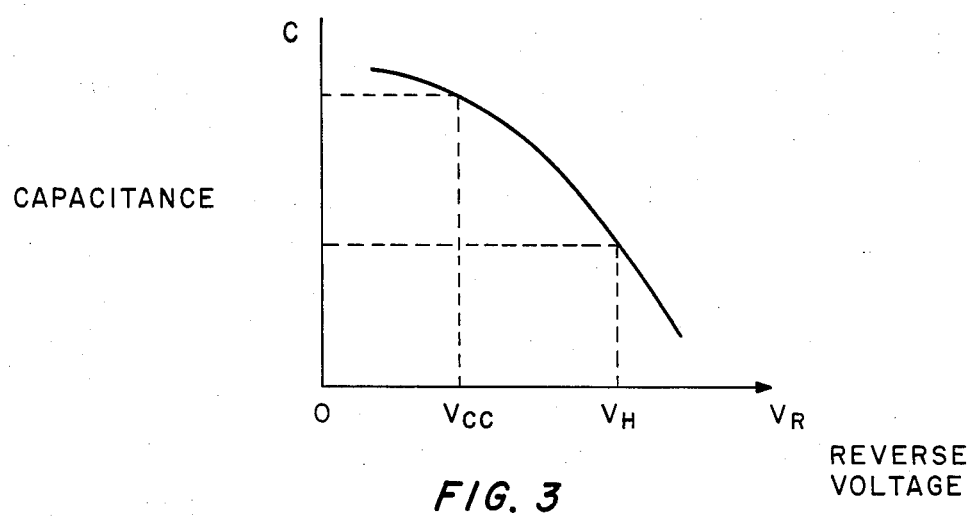
FIG. 3 is a graph showing the relationship between the reverse voltage and the capacitance of a variable capacitance diode in a VCO.

As stated above, the power voltage Vcc supplied to the charge pump 6 is the output voltage of a voltage regulator, which is +5 V in a portable radio transmitter/receiver or the like. For this reason, in the frequency synthesizer of the prior art, the variable range of the control voltage Vco to be applied to the terminal 101 of VCO 1 is restricted to between zero volts and Vcc, i.e., 5 volts. FIG. 3 shows the relationship between the reverse voltage $V_R$ and the capacitance C of a variable capacitance diode connected to the control terminal 101 of VCO 1. In the synthesizer of FIG. 1, the variance of the capacitance C is narrowly limited because the reverse voltage $V_R$ can vary only up to Vcc.

Figure 4:
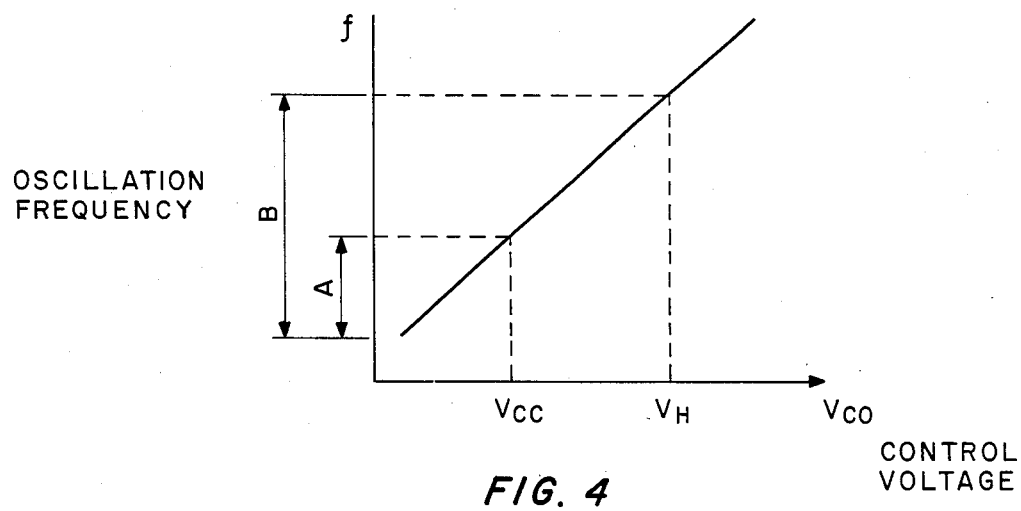
FIG. 4 is a graph showing the relationship between the control voltage and the oscillation frequency of VCO.
Figure 5:
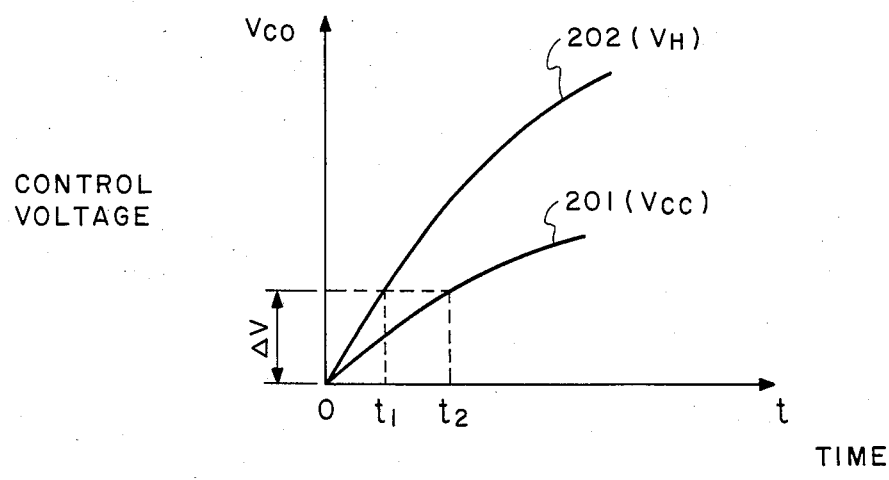
FIG. 5 is a diagram showing the rise time characteristic of the control voltage supplied to VCO.

FIG. 4 shows the relationship between the control voltage Vco and the oscillation frequency f of VCO 1. In the conventional synthesizer, the oscillation frequency f varies only within range A. Further, FIG. 5 shows the rise time of the control voltage Vco, which in the prior art synthesizer takes a time $t_2$ to reach a prescribed voltage $\Delta V$ as curve 201 indicates.

Figure 2:
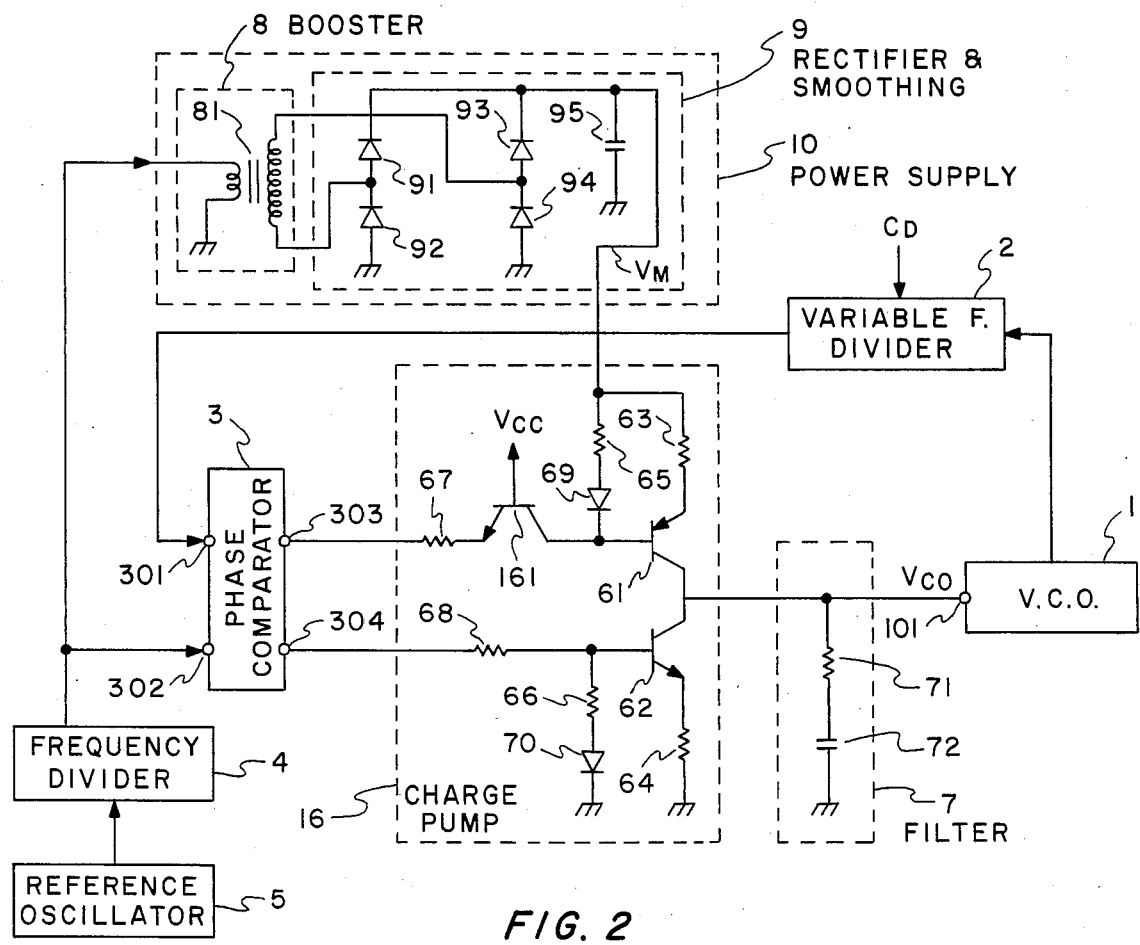
FIG. 2 is a block diagram illustrating a preferred embodiment of a PLL frequency synthesizer according to the invention.

In FIG. 2, the same symbols represent the same or equivalent constituents as in FIG. 1. The frequency synthesizer of FIG. 2 differs from that of FIG. 1 in that the D.C. voltage $V_H$ of a power supply circuit 10 is supplied as power voltage for a charge pump 16. The power supply circuit 10 comprises a booster circuit 8 having a transformer 81 for boosting the output of the frequency divider 4, and a rectifier circuit 9 for rectifying the output voltage of the booster circuit 8 into a D.C. voltage. The rectifier circuit 9 includes bridge diodes 91 to 94 and a capacitor 95. The capacitance of the capacitor 95 is set greater than that of the capacitor 72 in the loop filter 7.

The frequency division output of the frequency divider 4, after being boosted in voltage by the transformer 81, is rectified by the bridge diodes 91 to 94, charges the capacitor 95 and is used as power to drive the charge pump 16. The power supplied to the charge pump 16 has to charge the capacitor 72 of the loop filter 7. The capacitor 72 can be charged by the capacitor 95 because the latter has a greater capacitance than the former.

Since the output voltage $V_H$ of the power supply circuit 10 is substantially higher than the power voltage Vcc, a buffer transistor 161 is inserted between one end of a resistor 67 and the base of the transistor 61, both in the charge pump 16, to prevent the phase comparator 3 from destruction. To the base of the transistor 161 is applied the power voltage Vcc, so that no higher voltage than the balance of subtraction of the base-emitter voltage ($V_{BE}$) of the transistor 161 from Vcc may be applied to the phase comparator 3.

When the PLL is locked, the control voltage Vco supplied to VCO 1 becomes constant, and only a little current flows to the charge pump 16. As a result, the insertion of the capacitor 95 enables the output current value of the transformer 81 to be made extremely small and, therefore, the transformer 81 can be miniaturized. Since the output voltage $V_H$ of the power supply circuit 10 is higher than the power voltage Vcc, the capacitance C of the variable capacitance diode can be varied in a broader range, as shown in FIG. 3. Therefore, the Q value of the variable capacitance diode is increased, and the C/N ratio of the VCO 1 output is improved. Further, as shown in FIG. 4, the variable range of the oscillation frequency f of VCO 1 is extended to B. Moreover, the switching speed is so increased that, as indicated by curve 202 in FIG. 5, the prescribed voltage $\Delta V$ can be attained in only time $t_1$, shorter than time $t_2$ required by a conventional frequency synthesizer.

What is claimed is:
1. A PLL frequency synthesizer comprising:
a VCO for generating an oscillation of a frequency varying in response to a control voltage;
a variable frequency divider for dividing the output frequency of said VDO in a ratio according to a control signal;
a reference oscillator for supplying a reference signal having a predetermined frequency;
a fixed frequency divider for dividing the frequency of said reference signal in a fixed ratio;
a phase comparator for comparing the phases of the outputs of said fixed frequency divider and variable frequency divider to provide a control pulse corresponding to a phase difference between these ouputs;
a charge pump having a power supply terminal for generating a charge/discharge voltage in response to said control pulse;
a loop filter including a first capacitor supplied with said charge/discharge voltage for supplying to said VCO as said control voltage a voltage corresponding to said charge/discharge voltage; and
a power supply circuit for boosting the output voltage of said fixed frequency divider to provide a boosted D.C. voltage and for supplying said boosted D.C. voltage to said power supply terminal.

2. A PLL frequency synthesizer as claimed in claim 1, wherein said power supply comprises a booster circuit for boosting the output voltage of said fixed frequency divider and a rectifier and smooting circuit for rectifying the output of said booster circuit and smoothing the rectified output to provide said boosted D.C. voltage.

3. A PLL frequency synthesizer as claimed in claim 2, wherein said booster circuit comprises a transformer of which the primary side is coupled to the output of said fixed frequency divider and the secondary side is coupled as the output of said booster circuit, and wherein said rectifier and smoothing circuit is comprised of bridge diodes coupled to said secondary side of said transformer and a second capacitor connected to the outputs of said bridge diodes and to the output of said rectifier circuit.

4. A PLL frequency synthesizer as claimed in claim 3, wherein the capacitance of said second capacitor is greater than that of said first capacitor.

5. A PLL frequency synthesizer as claimed in claim 1, wherein said comparator supplies first and second outputs each according to the polarity of said phase difference, and wherein said charge pump comprises a first transistor whose base, collector and emitter are coupled to said first output of said comparator, the input of said loop filter and the output of said power supply circuit, respectively; a second transistor whose base, collector and emitter are coupled to said second output of said comparator, the input of said loop filter and the ground, respectively; and a third transistor whose emitter and collector are connected between said first output of said comparator and the base of said first transistor and whose base is connected to a power voltage.

6. A PLL frequency synthesizer as claimed in claim 5, wherein said power voltage is lower than the breakdown voltage of said phase comparator.

7. A PLL frequency synthesizer comprising:
reference oscillator means for generating a signal having a reference frequency;
VCO means for generating an oscillation of a frequency varying in response to a control voltage;
phase comparator means for comparing the output phases of said reference oscillator means and said VCO means and generating an output corresponding to a phase difference between these output phases;
charge pump means provided with power supply and responsive to the output of said phase comparator means to provide a pumping voltage;

filter means for filtering said pumping voltage and supplying the resultant to said VCO means as said control voltage; and booster means for boosting the output of said reference oscillator and supplying the boosted output to said charge pump means.

8. A PLL frequency synthesizer as claimed in claim 7, further comprising: first frequency divider means coupled to said reference oscillator means, to said phase comparator means and to said booster means for dividing the output frequency of said reference oscillator means; and second frequecy divider means coupled between said VCO means and said phase comparator means for dividing the output frequency of said VCO means according to a control signal.

9. A PLL frequency synthesizer as claimed in claim 7, wherein said phase comparator means generates two outputs according to the polarity of said phase difference, and wherein said charge pump means comprises a first transistor coupled to one of said two outputs, for charging said filter means, and a second transistor coupled to the other of said two outputs for discharging said filter means.

10. A PLL frequency synthesizer as claimed in claim 9, wherein said charge pump means further comprises a buffer transistor coupled between one of said two outputs and said first transistor.

11. A method for use in a PLL frequency synthesizer, for controlling the oscillation frequency of a VCO, comprising the following steps of:

generating from said VCO a first signal having a frequency corresponding to a control voltage;

generating a reference signal having a prescribed frequency;

comparing said first signal and said reference signal, and outputting a second signal according to a phase difference therebetween;

boosting the voltage of said reference signal to provide a boosted D.C. voltage;

charging and discharging a first capacitor with said boosted D.C. voltage in response to said second signal; and supplying the terminal voltage of said first capacitor to said VCO as said control voltage.

12. A method as claimed in claim 11, further comprising the following steps of: dividing the frequency of said first signal in a ratio according to a control signal; and charging a second capacitor with said boosted D.C. voltage.

13. A method as claimed in claim 12, wherein the capacitance of said second capacitor is greater than that of said first capacitor.

14. A method for use in a PLL frequency synthesizer, for controlling the oscillation frequency of a VCO, comprising the following steps of:

generating a first signal having a frequency corresponding to a control voltage;

dividing the frequency of said first signal in a ratio according to a control signal;

generating a reference signal having a prescribed frequency;

dividing the frequency of said reference signal in a fixed ratio;

comparing the phases of signals resulting from frequency divisions in said ratio according to said control signal and in said fixed ratio, and outputting a control pulse corresponding to a phase difference between these signals;

generating a charge/discharge voltage according to said control pulse;

charging or discharging a first capacitor with said charge/discharge voltage and generating a voltage across said first capacitor as said control voltage; and boosting the voltage of said signal frequency-divided in said fixed ratio, and using the boosted voltage as said charge/discharge voltage.

15. A method as claimed in claim 14, further comprising the following steps of:

smoothing said boosted voltage; and charging a second capacitor with the smoothed voltage.

16. A method as claimed in claim 15, wherein the capacitance of said second capacitor is greater than that of said first capacitor.

* * * * *